(12) United States Patent
Shen et al.

(10) Patent No.: US 10,546,845 B2
(45) Date of Patent: Jan. 28, 2020

(54) PACKAGE ON PACKAGE STRUCTURE

(71) Applicant: Taiwan Semiconductor Manufacturing Co., Ltd., Hsinchu (TW)

(72) Inventors: Dong-Han Shen, Kaohsiung (TW); Chen-Shien Chen, Hsinchu County (TW); Kuo-Chio Liu, Hsinchu (TW); Hsi-Kuei Cheng, Hsinchu County (TW); Yi-Jen Lai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/957,914

(22) Filed: Apr. 20, 2018

(65) Prior Publication Data

US 2019/0326264 A1    Oct. 24, 2019

(51) Int. Cl.
| | |
|---|---|
| *H01L 23/00* | (2006.01) |
| *H01L 23/31* | (2006.01) |
| *H01L 23/538* | (2006.01) |
| *H01L 25/065* | (2006.01) |
| *H01L 25/10* | (2006.01) |
| *H01L 25/18* | (2006.01) |

(52) U.S. Cl.
CPC ........ *H01L 25/105* (2013.01); *H01L 23/3128* (2013.01); *H01L 23/5389* (2013.01); *H01L 24/24* (2013.01); *H01L 25/18* (2013.01); *H01L 25/0652* (2013.01); *H01L 2224/24265* (2013.01); *H01L 2224/2518* (2013.01); *H01L 2224/25171* (2013.01); *H01L 2225/1035* (2013.01); *H01L 2225/1041* (2013.01); *H01L 2225/1058* (2013.01); *H01L 2225/1076* (2013.01)

(58) Field of Classification Search
CPC ..... H01L 2924/3511; H01L 2225/1064; H01L 25/105; H01L 23/2107; H01L 2924/181
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |

(Continued)

*Primary Examiner* — Charles D Garber
*Assistant Examiner* — Alia Sabur
(74) *Attorney, Agent, or Firm* — JCIPRNET

(57) ABSTRACT

A package on package structure includes a first package, a plurality of conductive bumps, a second package and an underfill. The conductive bumps are disposed on a second surface of the first package and electrically connected to the first package. The second package is disposed on the second surface of the first package through the conductive bumps, and includes a semiconductor device and an encapsulating material encapsulating the semiconductor device. A shortest distance from an upper surface of the encapsulating material to an upper surface of the semiconductor device is greater than or substantially equal to twice a thickness of the semiconductor device. The underfill is filled between the first package and the second package.

20 Claims, 9 Drawing Sheets

(56) References Cited

U.S. PATENT DOCUMENTS

| | | |
|---|---|---|
| 9,496,189 B2 | 11/2016 | Yu et al. |
| 9,666,502 B2 | 5/2017 | Chen et al. |
| 9,735,131 B2 | 8/2017 | Su et al. |
| 2012/0280404 A1* | 11/2012 | Kwon ................. H01L 23/3737 257/777 |
| 2012/0319284 A1* | 12/2012 | Ko ......................... H01L 24/92 257/773 |
| 2013/0147054 A1* | 6/2013 | Lin ......................... H01L 24/96 257/774 |
| 2016/0056057 A1* | 2/2016 | Yu ...................... H01L 21/4846 257/774 |
| 2016/0351462 A1* | 12/2016 | Kuan .................... H01L 24/05 |

* cited by examiner

PACKAGE ON PACKAGE STRUCTURE

BACKGROUND

As the demand for smaller electronic products grows, manufacturers and others in the electronics industry continually seek ways to reduce the size of integrated circuits used in the electronic products. In that regard, three-dimensional type integrated circuit packaging techniques have been developed and used.

Fabrication of 3D integrated chips requires stacking of multiple semiconductor packages, coupling of circuitry between respective packages, and bonding the packages with an electrically-insulating adhesive to form a package-on-package structure. Subsequent high-temperature processing steps such as curing the electrically-insulating adhesive subjects the package-on-package structure to mechanical stress which can result in unintended side-effects such as warpage, cracking, delamination, and defect formation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
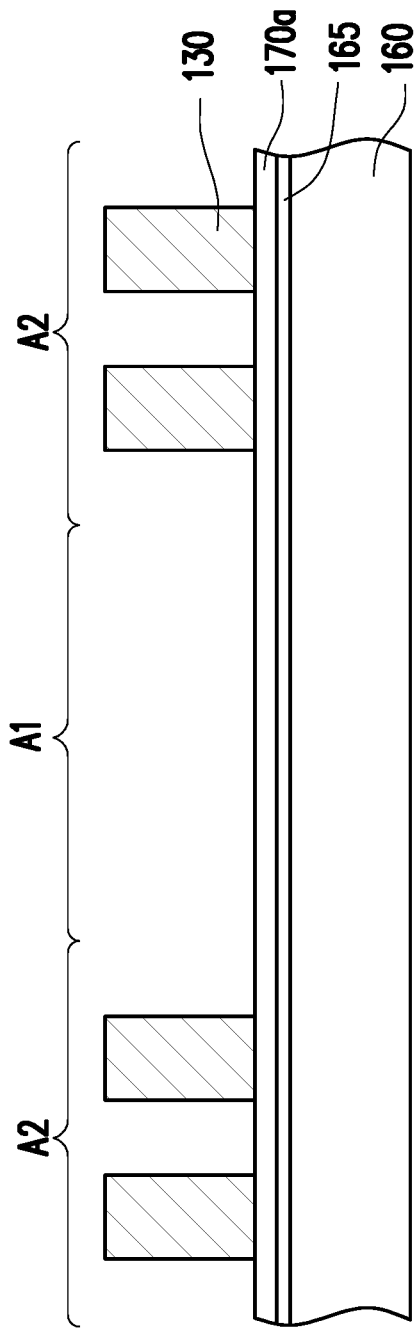
FIG. 1 to FIG. 8 illustrate cross sectional views of intermediate stages in the manufacturing of a package on package structure according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 8 illustrate cross sectional views of intermediate stages in the manufacturing of a package on package structure according to some exemplary embodiments of the present disclosure. It is noted that the present disclosure will be described with respect to some embodiments in a specific context, namely a Package on Package (PoP) structure. The concepts in the disclosure may also apply, however, to other semiconductor structures or circuits. A PoP structure and the method of forming the POP structure are provided in accordance with various embodiments. The intermediate stages of forming the PoP structure are illustrated in accordance with some embodiments. The variations of the embodiments are discussed. Throughout the various views and illustrative embodiments, like reference numbers are used to designate like elements.

Figure 8:
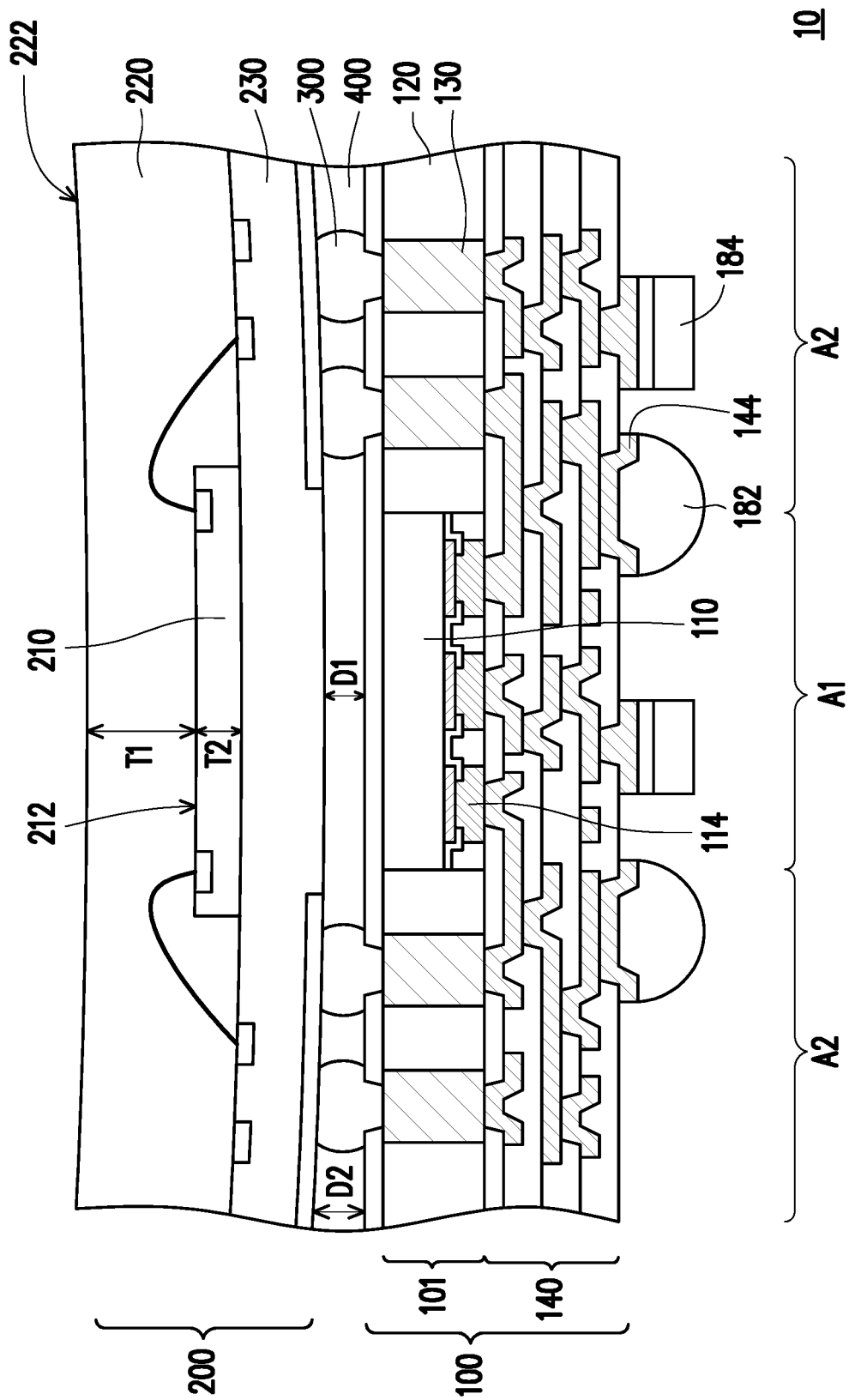

In some embodiments, the intermediate stages of forming the PoP structure 10 as shown in FIG. 8 are described as follows. Referring to FIG. 1, a carrier 160 is provided, and an adhesive layer 165 may be disposed on the carrier 160. In some embodiments, the carrier 160 may be a glass carrier, a ceramic carrier, or the like. The adhesive layer 165 may be a light to heat conversion release coating (LTHC), or the like. In some embodiments, an insulation layer 170a may be optionally disposed on the carrier 160, or on the adhesive layer 165 (if any). Then, a plurality of through vias 130 are formed on the carrier 160, and the through vias 130 surrounds a central region A1 where a first semiconductor device 110 is to be disposed. In some embodiments, the through vias 130 are disposed on a peripheral region A2 of the carrier 160 surrounding the central region A1. It is noted that "central" and "peripheral" herein may not be interpreted literally but rather be deemed as spatially relative terms, which are intended to encompass different orientations of the device in use or operation in addition to the orientation depicted in the figures. In the present embodiment, the through vias 130 are formed on the insulation layer 170a located on the carrier 160, but the disclosure is not limited thereto. In an alternative embodiment, the insulation layer 170a and the adhesive layer 165 may be omitted, and the through vias 130 are directly formed on the carrier 160.

Figure 2:
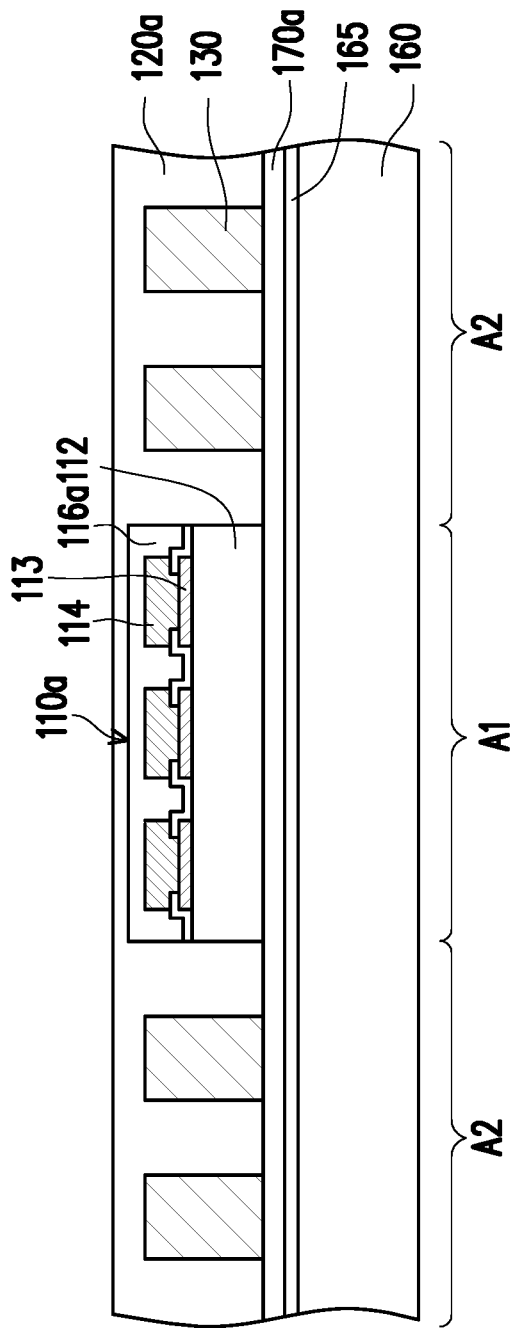

In some embodiments, at least one a first semiconductor device 110a as shown in FIG. 2 is formed on the carrier 160 and located within the central area A1. In the present embodiment, the first semiconductor device 110a is formed on the insulation layer 170a located on the carrier 160, but the disclosure is not limited thereto. In some embodiments, the first semiconductor device 110a may be logic chips including logic circuits therein. In some exemplary embodiments, the number of the first semiconductor device 110a may be plural and are device dies that are designed for mobile applications, and may include a Power Management Integrated Circuit (PMIC) die and a Transceiver (TRX) die, for example. Although one first semiconductor device 110a are illustrated, more semiconductor device may be placed over the carrier 160 and level with one another.

In some embodiments, the carrier 160 may include a plurality of central regions A1 arranged in, for example, an array manner. Accordingly, the through vias 130 may be formed to surround each of the central regions A1, and a plurality of first semiconductor device 110a may be disposed on the central regions A1 respectively, so the through vias 130 may surround each of the first semiconductor device 110a. With such arrangement, a plurality of POP structures can be formed concurrently. For the sake of brevity and clarity, the manufacturing process of one of the POP structures is illustrated in FIG. 1 to FIG. 8. For example, one of the central regions A1 surrounded by some of the through vias 130 are illustrated in FIG. 1.

In some embodiments, the through vias 130 may be pre-formed, and are then placed on the carrier 160. In alternative embodiments, the through vias 130 may be formed by, for example, plating process. The plating of the through vias 130 may be performed before the placement of the first semiconductor device 110a, and may include the following steps. For example, a seed layer (not shown) is firstly over carrier 160, a photo resist layer (not shown) is formed and patterned, and the through vias 130 are plated on the portions of the seed layer that are exposed through the photo resist layer. The photo resist layer and the portions of the seed layer covered by the photo resist layer may then be removed. The first semiconductor device 110a may then be placed over the carrier 160. The material of the through vias 130 may include copper, aluminum, or the like. Accordingly, the bottom ends of the through vias 130 are substantially level with the back surface of the first semiconductor device 110a.

In some exemplary embodiments, a plurality of conductive vias 114 (such as copper vias) may be formed on an active surface (e.g. the top surface) of the first semiconductor device 110a and electrically coupled to the pads 113 on the substrate 112 of the first semiconductor device 110a. In some embodiments, a dielectric layer 116a may be formed on the active surface (e.g. the top surface) of the first semiconductor device 110a, and may cover the top surfaces of the conductive vias 114. In other embodiments, the top surface of the dielectric layer 116a may be substantially level with the top surfaces of the conductive vias 114. Alternatively, the dielectric layer 116a may be omitted, and the conductive vias 114 protrude from the active surface of the first semiconductor device 110. In some embodiments, the top ends of the through vias 130 may be substantially level with the top surfaces of the conductive vias 114. In other embodiments, the top ends of the through vias 130 may be substantially higher than the top surfaces of the conductive vias 114. Alternatively, the top ends of the through vias 130 may be substantially lower than the top surfaces of the conductive vias 114 but substantially higher than the bottom surfaces of the conductive vias 114.

Then, the first semiconductor device 110a and the through vias 130 on the carrier 160 are encapsulated by a first encapsulating material 120a. In other words, the first encapsulating material 120a is formed on the carrier 160 to encapsulate the through vias 130 at the peripheral region A2 and the first semiconductor device 110a at the central region A1. In some embodiments, the first encapsulating material 120a fills the gaps between the first semiconductor device 110a and the through vias 130, and may be in contact with the insulation layer 170a. The first encapsulating material 120a may include a molding compound, an epoxy, or a resin, etc. In some embodiments, a top surface of the first encapsulating material 120a may be higher than the top ends of the through vias 130 and the top surface of the dielectric layer 116a. Namely, the first encapsulating material 120a covers the top ends of the through vias 130 and the top surface of the dielectric layer 116a.

Figure 3:
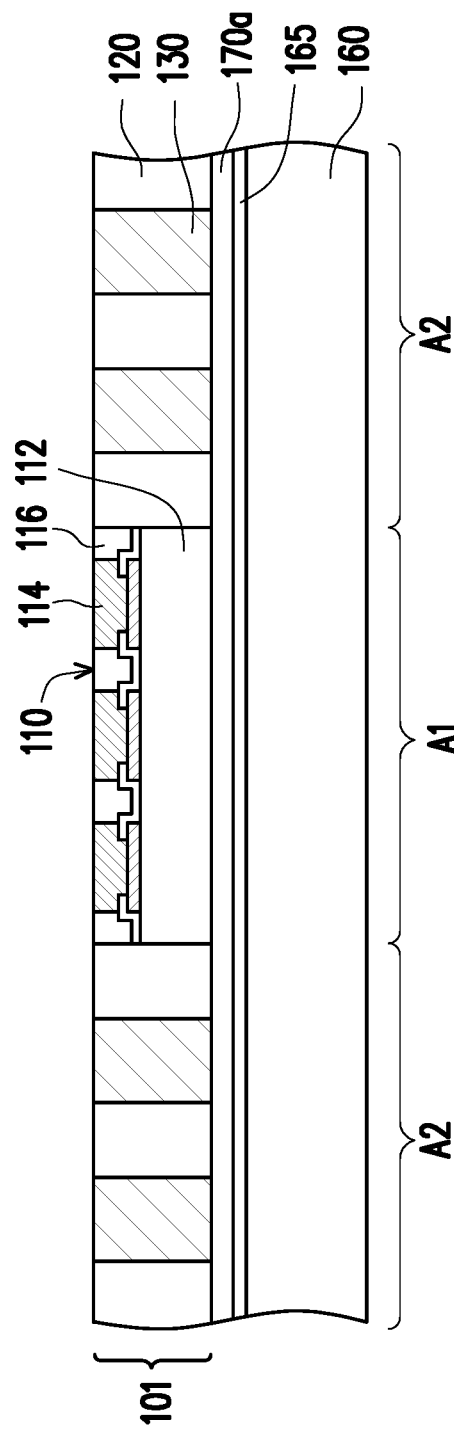

Then, a thinning process, which may be a grinding process, is performed to thin the first encapsulating material 120a (and the dielectric layer 116a) until the top ends of the through vias 130 and the top surfaces of the conductive vias 114 are revealed. The resulting structure is shown in FIG. 3. Due to the thinning process, the top ends of the through vias 130 are substantially level with the top surfaces of the conductive vias 114, and are substantially level with the top surface of the first encapsulating material 120 and the top surface of the dielectric layer 116 as shown in FIG. 3. Throughout the description, the resultant structure including the first semiconductor device 110, the through vias 130 and the first encapsulating material 120 as shown in FIG. 3 is referred to as an encapsulated semiconductor device 101, which may have a wafer form in the process. Accordingly, in the encapsulated semiconductor device 101, the first semiconductor device 110 is disposed at the central region A1, the through vias 130 extend through the first encapsulating material 120 at the peripheral region A2 surrounding the central region A1, and the first encapsulating material 120 encapsulates the first semiconductor device 110 and the through vias 130. In other words, the first encapsulating material 120 encapsulates the first semiconductor device 110 therein, and the through vias 130 extends through the first encapsulating material 120.

Figure 4:
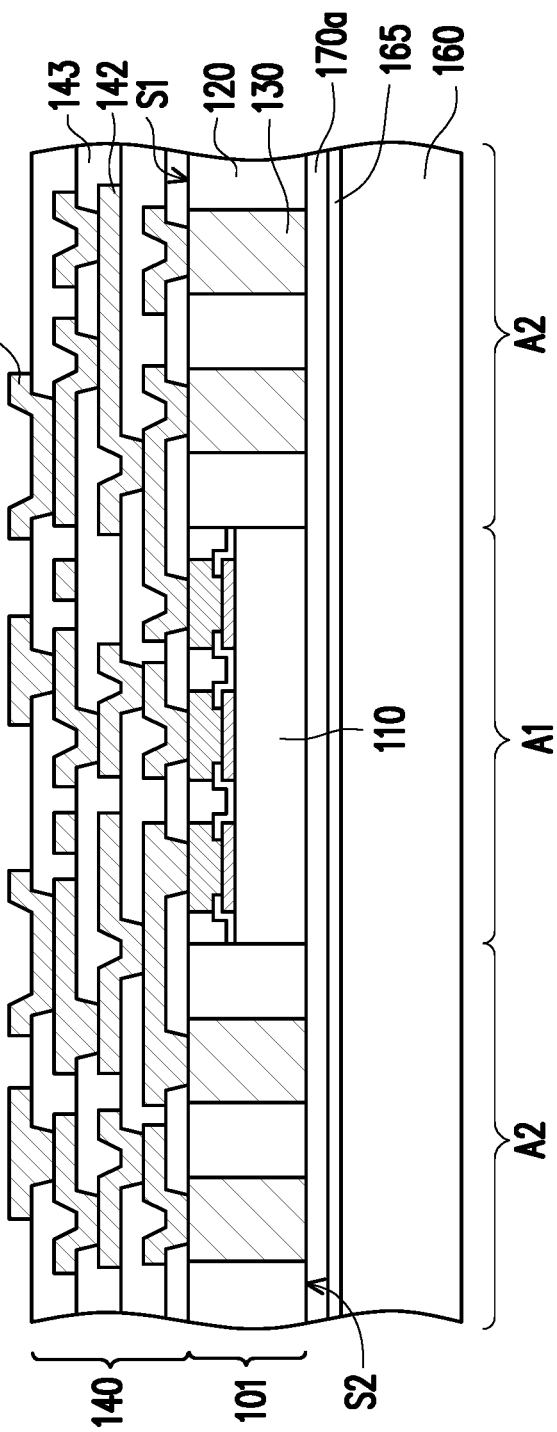

Next, referring to FIG. 4, a redistribution structure 140 is formed on a first surface S1 of the encapsulated semiconductor device 101. The redistribution structure 140 is electrically connected to the first semiconductor device 110 and the through vias 130 of the encapsulated semiconductor device 101. In some embodiments, the redistribution structure 140 are formed over the encapsulated semiconductor device 101 to connect to the conductive vias 114 of the first semiconductor device 110 and the through vias 130. In some embodiments, the redistribution structure 140 may also interconnect the conductive vias 114 and the through vias 130. The redistribution structure 140 may be formed by, for example, depositing conductive layers, patterning the conductive layers to form redistribution circuits 142, partially covering the redistribution circuits 142 and filling the gaps between the redistribution circuits 142 with dielectric layers 143, etc. The material of the redistribution circuits 142 may include a metal or a metal alloy including aluminum, copper, tungsten, and/or alloys thereof. The dielectric layers 143 may be formed of dielectric materials such as oxides, nitrides, carbides, carbon nitrides, combinations thereof, and/or multi-layers thereof. The redistribution circuits 142 are formed in the dielectric layers 143 and electrically connected to the first semiconductor device 110 and the through vias 130. In addition, an Under Bump Metallurgy (UBM) layer 144 may be formed on the redistribution structure 140 by sputtering, evaporation, or electroless plating, etc.

Figure 5:
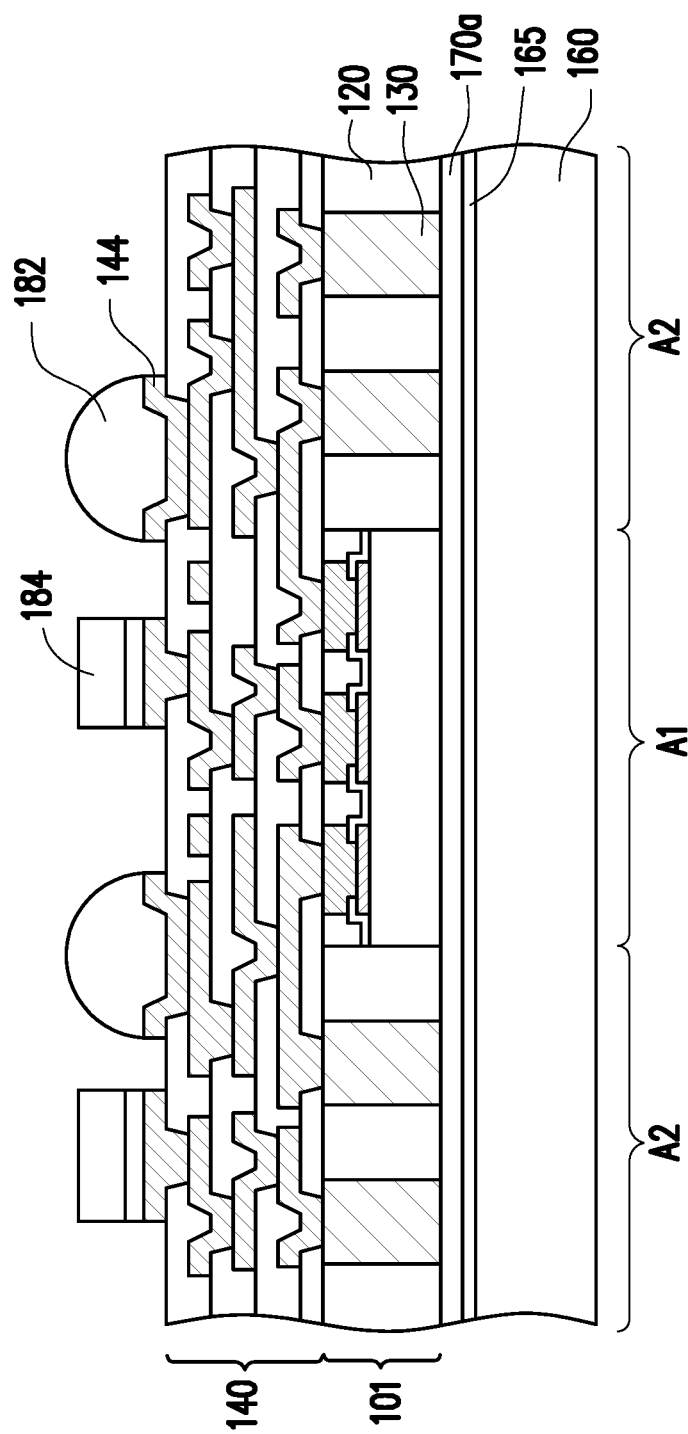

Referring to FIG. 5, at least one of electrical connector 182 and at least one Integrated Passive Device (IPD) 184 are disposed on the redistribution circuit structure 140 in accordance with some exemplary embodiments. The formation of the electrical connectors 182 may include placing solder balls on the UBM layer 144 (or on the redistribution circuit structure 140), and then reflowing the solder balls. In alternative embodiments, the formation of the electrical connectors 182 may include performing a plating process to form solder regions on the UBM layer 144 (or on the redistribution circuit structure 140), and then reflowing the solder regions. The electrical connector 182 may also include conductive pillars, or conductive pillars with solder caps, which may also be formed through plating. The IPD 184 may be fabricated using standard wafer fabrication technologies such as thin film and photolithography processing, and may be mounted on the redistribution circuit structure 140 through, for example, flip-chip bonding or wire bonding, etc.

Figure 6:
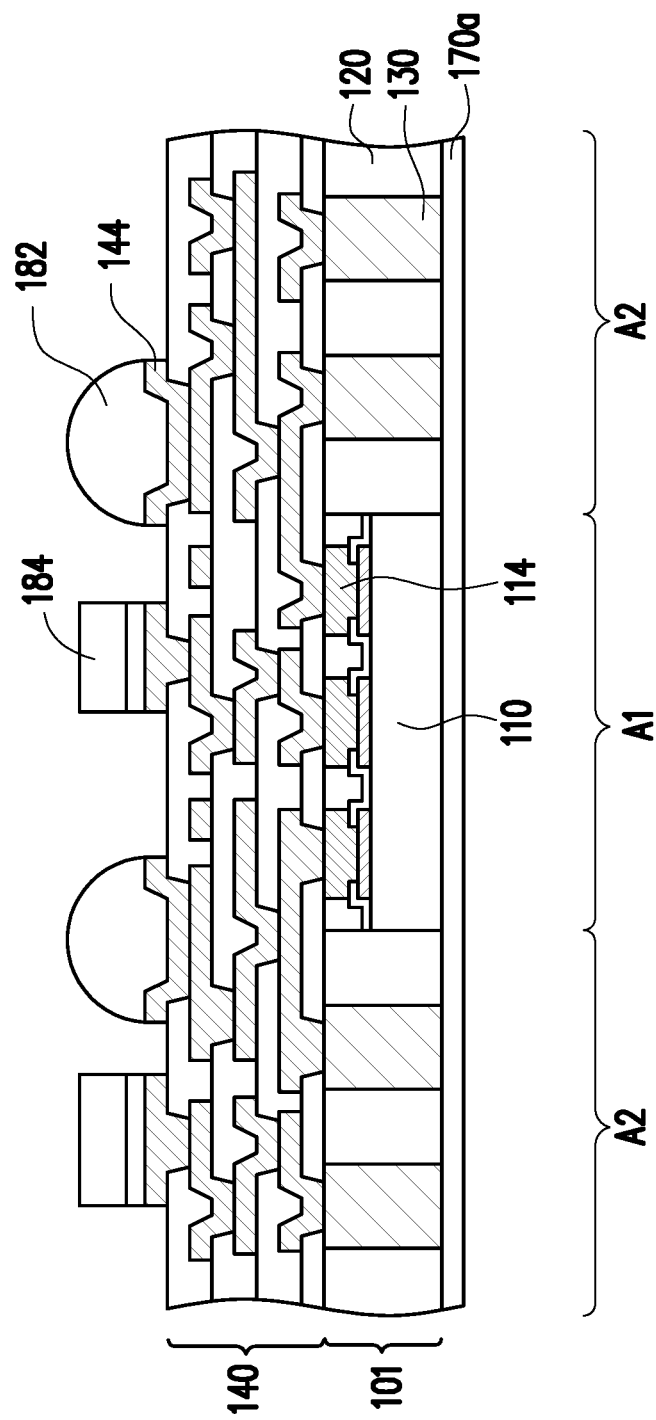

Then, referring to FIG. 6, the carrier 160 may be removed. In some embodiments, the carrier 160 is detached from the encapsulated semiconductor device 101, and the insulation layer 170a (if any), by causing the adhesive layer 165 to lose or reduce adhesion. The adhesive layer 165 is then removed along with the carrier 160. For example, the adhesive layer 165 may be exposed to UV light, so that the adhesive layer 165 loses or reduces adhesion, and hence the carrier 160 and the adhesive layer 165 can be removed from the encapsulated semiconductor device 101.

After the carrier 160 is removed, the bottom ends of the through vias 130 are revealed. In the illustrated structure, the bottom ends of the through vias 130 are level with the bottom surface of the first semiconductor device 110 and the bottom surface of the first encapsulating material 120. In the embodiments of the insulation layer 170a being omitted, a grinding process may be performed to lightly grind the back surface of first semiconductor device 110 and the bottom ends of the through vias 130. Alternatively, the grinding process may be skipped.

Figure 7:
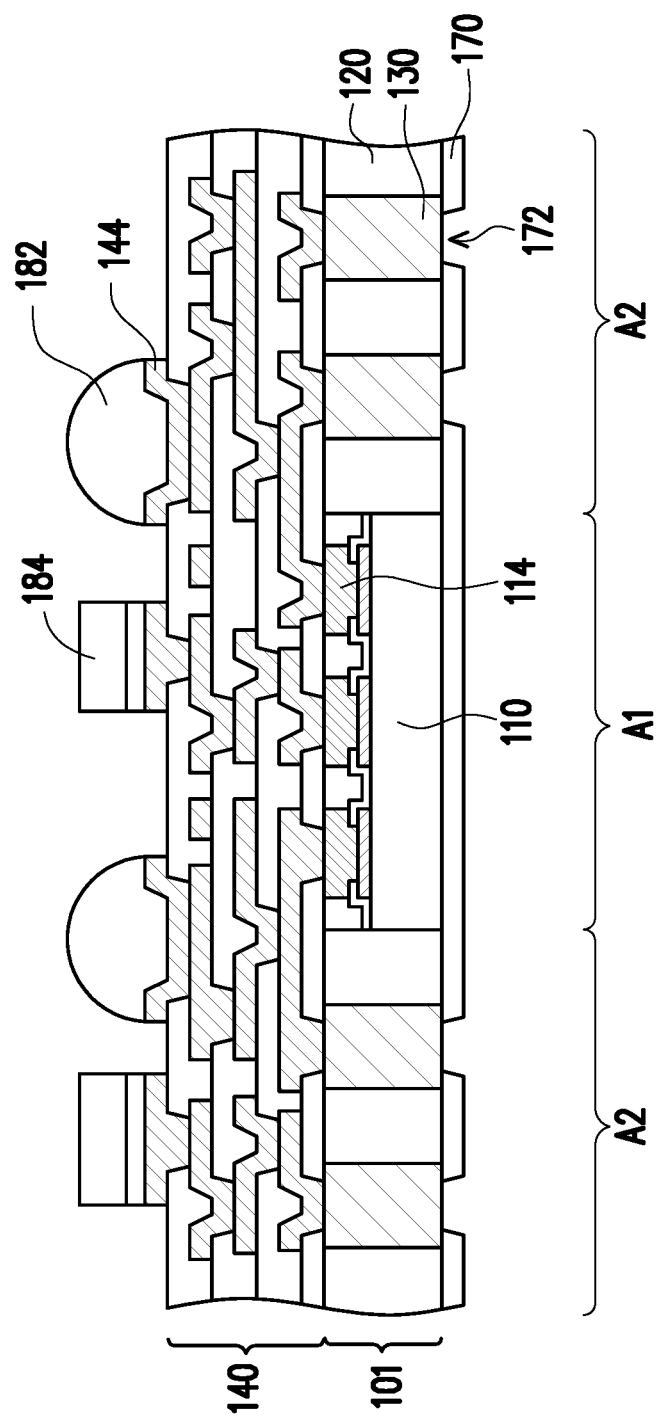

Referring to FIG. 7, in the embodiments having the insulation layer 170a, a patterning process may then be performed on the insulation layer 170a to form a plurality of openings 172. Accordingly, the insulation layer 170 having a plurality of openings 172 are formed. The openings 172 are located on the through vias 130 respectively to reveal the bottom ends of the through vias 130. In some embodiments, the openings 172 may be formed by photolithography process, laser drilling process, etc. Accordingly, the resulting structure is the first package 100 as shown in FIG. 7.

Referring to FIG. 8, a plurality of conductive bumps 300 may be formed on a second surface S2 of the encapsulated semiconductor device 101 of the first package 100 to be electrically connected to the through vias 130 of the first package 100. The second surface S2 is opposite to the first surface S1. Namely, the redistribution structure 140 and the conductive bumps 300 are disposed on two opposite surfaces S1, S2 of the encapsulated semiconductor device 101 respectively. In some embodiments, the conductive bumps 300 are disposed in the openings 172 of the insulation layer 170 to be connected to the through vias 130. In some embodiments, the conductive bumps 300 are disposed on the peripheral region A2 of the second surface S2 and surround the central region A1 where the first semiconductor device 110 is located within.

Then, a second package 200 is disposed on the first package 100 and electrically connected to the through vias 130 through the conductive bumps 300. In some embodiments, the second package 200 is disposed on the second surface S2 of the encapsulated semiconductor device 101 through the conductive bumps 300. The second package 200 is mounted on the first package 100 in a manner of a lower surface 201 of the second package 200 facing the second surface S2 of the encapsulated semiconductor device 101. In some embodiments, the second package 200 may be packages, device dies, passive devices, and/or the like. In some embodiments, the package on package structure 10 may combine vertically discrete memory and logic packages, and the second package 200 may be employed in a memory such as Dynamic Random Access Memory (DRAM) and others, but the disclosure is not limited thereto.

Then, an underfill 400 is filled into a gap between the first package 100 and the second package 200 to reinforce the strength of the conductive bumps 300 and therefore the overall package-on-package structure 10. In some embodiments, the underfill 400 covers both of the central region A1 and the peripheral region A2 and encapsulates the conductive bumps 300. The underfill 400 may then be cured by a thermal curing process, and the curing temperature may range from about 100° C. to 150° C. Accordingly, the resulting structure is a package on package structure 10 as shown in FIG. 8.

In some embodiments, the second package 200 may be mounted on the first package 100 by flip-chip bonding and the second package 200 may include at least one second semiconductor device 210 disposed on a redistribution structure 230 and a second encapsulating material 220 encapsulating the second semiconductor device 210. In some embodiments, the redistribution structure 230 may be a package substrate. In other embodiments, the redistribution structure 230 may be a redistribution layer (RDL) similar to the redistribution structure 140, which is formed by, for example, depositing conductive layers, patterning the conductive layers to form redistribution circuits, partially covering the redistribution circuits and filling the gaps between the redistribution circuits with dielectric layers, etc.

In general, during the bonding process, if the second semiconductor device 210, the second encapsulating material 220 and the redistribution structure 230 have different coefficients of thermal expansion (CTE), differential expansion occurs when the package 200 is heated and cooled. The differential expansion places large stress on the solder ball connections, which may cause warpage of the second package 200. Additional challenges present themselves when a flip chip package is included in a package on package configuration. In the package on package structure 10, two packages 100 and 200 such as an application specific IC (ASIC) and a memory package (e.g. Dynamic Random Access Memory, DRAM) are installed one on top of the other. For example, the second package 200 may be larger than the first package 100, and may have an array of conductive bumps 300 around its perimeter for forming connections to the first package 100. Configurations such as the package on package structure 10 increase the likelihood of package warpage.

Accordingly, when the underfill 400 is dispensed between the first package 100 and the second package 200 with warpage profiles, the underfill 400 may not fill the gap completely, which results in void formation within the underfill 400. In addition, with the high-temperature curing, the voids within the underfill 400 will grow and nucleate rapidly to result in the delamination. Therefore, it is important to control the warpage profile of the package on package structure 10 for the underfill 400 to fill the gap between first package 100 and the second package 200 without void formation.

To obtain the relationship between warpage of the package and the failure of the underfill 400 (e.g. crack or delamination, etc.) during curing process, series of experiments are conducted, and the failure rate of the underfill 400 for the package on package structure 10 resulting from different amount of warpage of the second package 200 may be calculated accordingly. To monitor warpage of the package on package structure 10, a co-planarity measurement tool may be adopted, which may employ a Shadow Moire' technique to measure co-planarity of the package on package structure 10. Certainly, the following experimental data and conditions are provided for the purpose of illustration only, and the disclosure is not limited thereto, but rather encompasses all variations, which are relevant as a result of the teachings provided herein.

Figure 9:
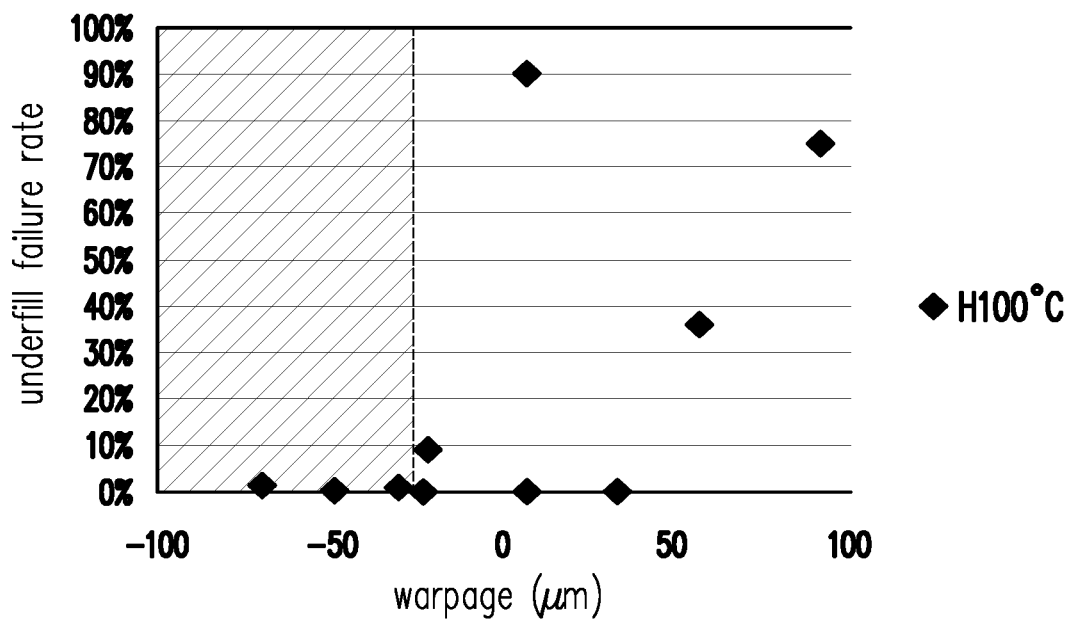
FIG. 9 depicts a diagram illustrating the relationship between warpage of the second package and the underfill failure rate under designated temperature.
Figure 10:
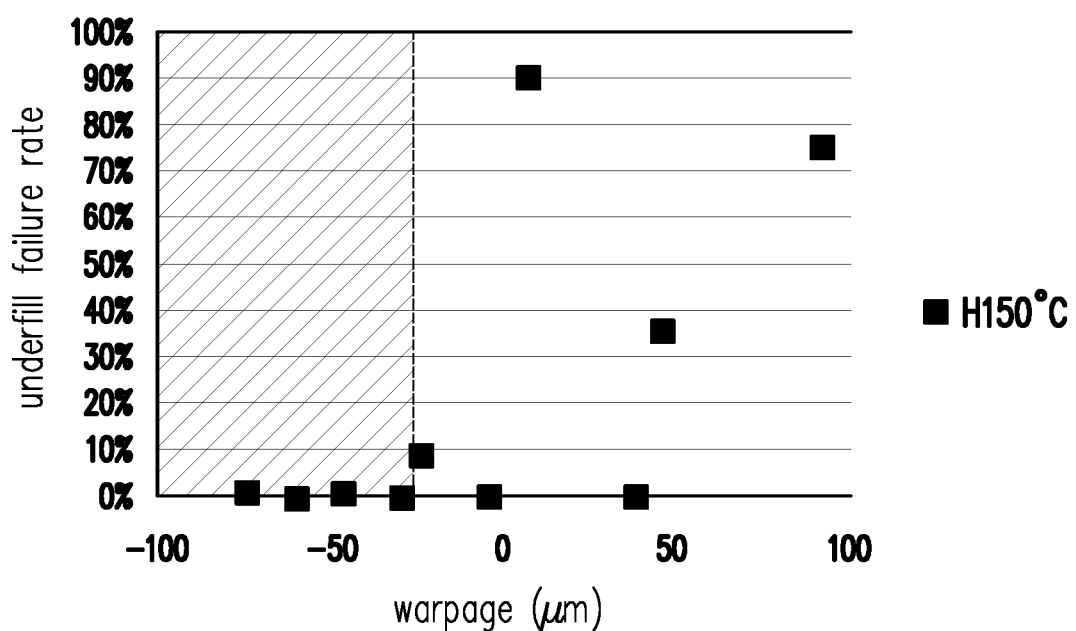
FIG. 10 depicts a diagram illustrating the relationship between warpage of the second package and the underfill failure rate under another designated temperature.

FIG. 9 depicts a diagram illustrating the relationship between warpage of the second package and the underfill failure rate under designated temperature. FIG. 10 depicts a diagram illustrating the relationship between warpage of the second package and the underfill failure rate under another designated temperature. In the experiments shown in FIG. 9, the package on package structure 10 is exposed to a designated temperature of 100° C. or so to simulate the curing process of the underfill 400. It is found that when the warpage of the second package 200 is substantially equal to or smaller than about −20 μm, the failure rate of the underfill 400 reaches 0%. In addition, when the second package 200 is in concave warpage profile (i.e. the warpage of the second package 200 is in negative value), the failure rate of the underfill 400 is under 10%.

In the experiments shown in FIG. 10, the package on package structure 10 is exposed to a designated temperature of 150° C. or so to simulate the curing process of the underfill 400. Similarly, it is found that when the warpage of the second package 200 is substantially equal to or smaller than about −20 μm, the failure rate of the underfill 400 reaches 0%. In addition, when the second package 200 is in concave warpage profile (i.e. the warpage of the second package 200 is in negative value), the failure rate of the underfill 400 is also under 10%.

In the light of this, the warpage profile of the second package 200 is controlled to be in a concave warpage profile to reduce failure rate of the underfill 400. In one of the implementations, a lower surface 201 of the second package 200 is curved toward the second surface S2 of the encapsulated semiconductor device 101, and the lower surface 201 is the surface that faces the second surface S2. In some embodiments, a shortest distance D1 from the central region A1 of the second surface S2 to the second package 200 is substantially smaller than a shortest distance D2 from anywhere on the peripheral region A2 of the second surface S2 to the second package 200. That is to say, the distance (e.g. gap width) between the first package 100 and the second package 200 gradually reduces from the peripheral region A2 to the central region A1 as it is shown in FIG. 8. For example, the shortest distance D1 at the central region A1 may range substantially from 30 μm to 60 μm, and the shortest distance D2 at the peripheral region A2 may range substantially from 100 μm to 140 μm. Certainly, the numerical ranges in the examples are provided for the purpose of illustration only, and the disclosure is not limited to the examples, but rather encompasses all variations which are relevant as a result of the teachings provided herein.

To achieve that concave warpage profile of the second package 200, a shortest distance T1 from an upper surface 222 of the second encapsulating material 220 to an upper surface 212 of the second semiconductor device 210 is greater than or substantially equal to twice the thickness T2 of the second semiconductor device 210 (i.e. T1≥2·T2). With such configuration, the second package 200 would be in concave warpage profile after thermal process due to thermal expansion mismatch between the components of the second package 200, so the gap width between the first package 100 and the second package 200 gradually reduces from the peripheral region A2 to the central region A1. Thereby, when the underfill 400 is dispensed from the peripheral region A2 and flows toward the central region A1, the underfill 400 can easily fill the gap at the central region A1 owing to capillary action without void formation.

Figure 11:
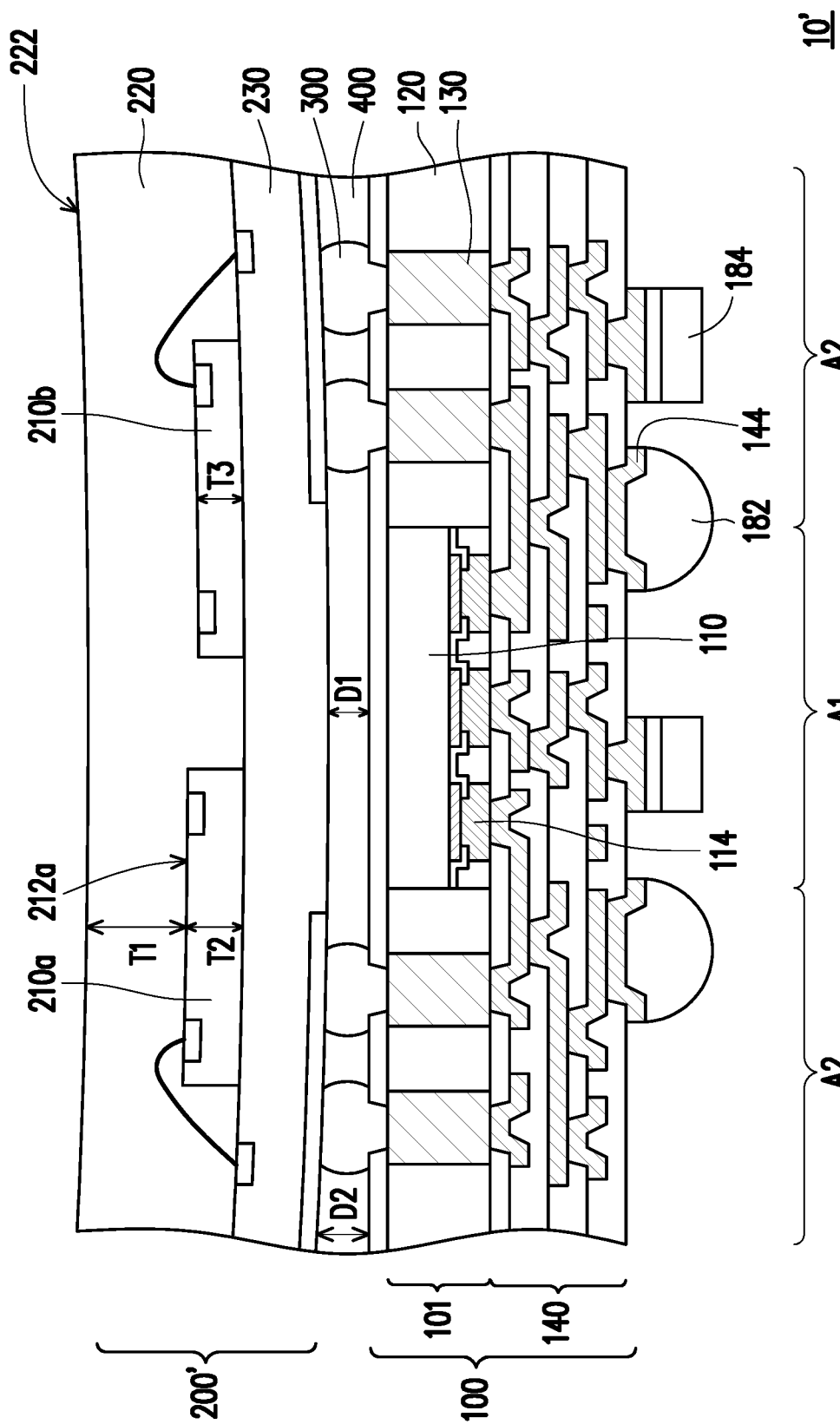
FIG. 11 illustrates a cross sectional view of a package on package structure according to some exemplary embodiments of the present disclosure.

FIG. 11 illustrates a cross sectional view of a package on package structure according to some exemplary embodiments of the present disclosure. It is noted that the package on package structure 10' shown in FIG. 11 contains many features same as or similar to the package on package structure 10 disclosed earlier with FIG. 8. For purpose of clarity and simplicity, detail description of same or similar features may be omitted, and the same or similar reference numbers denote the same or like components. The main differences between the package on package structure 10' shown in FIG. 11 and the package on package structure 10 shown in FIG. 8 are described as follows.

In some embodiments, the second package 200' includes a plurality of second semiconductor devices 210a, 210b disposed on a redistribution structure 230 and a second encapsulating material 220 encapsulating the second semiconductor devices 210a, 210b. In some embodiments, the redistribution structure 230 may be a package substrate. In other embodiments, the redistribution structure 230 may be a redistribution layer (RDL) similar to the redistribution structure 140. In some embodiments, a shortest distance T1 from an upper surface 222 of the second encapsulating material 220 to a topmost surface of the second semiconductor devices 210a, 210b is greater than or substantially equal to twice a greatest thickness of the second semiconductor devices 210a, 210b.

In the present embodiment, the second semiconductor devices 210a, 210b are disposed on the redistribution structure 230 in a side-by-side manner. The thicknesses T2, T3 of the second semiconductor devices 210a, 210b may be the same. In this case, the shortest distance T1 from the upper surface 222 to the top surface 212a or 212b of any one the second semiconductor device 210a or 210b is greater than or substantially equal to twice the thickness T2 or T3 of any one of the second semiconductor device 210a or 210b. In other embodiments, the thicknesses T2, T3 of the second semiconductor devices 210a, 210b may be different. For example, the thicknesses T2 of the second semiconductor device 210a is greater than the thicknesses T3 of the second semiconductor device 210b. In this case, the shortest distance T1 from the upper surface 222 to the top surface 212a of the second semiconductor device 210a is greater than or substantially equal to twice the thickness T2 of the second semiconductor device 210a. It is noted that two second semiconductor devices 210a, 210b are illustrated in FIG. 11, but the disclosure does not limit the arrangement and the number of the second semiconductor devices 210a, 210b in the second package 200.

With such configuration, the second package 200' would be in concave warpage profile after thermal process, so the gap width between the first package 100 and the second package 200' gradually reduces from the peripheral region A2 to the central region A1. Thereby, when the underfill 400 is dispensed from the peripheral region A2 and flows toward the central region A1, the underfill 400 can flow over the central region A1 easily owing to capillary action, and fill the gap between the first package 100 and the second package 200' without void formation.

Figure 12:
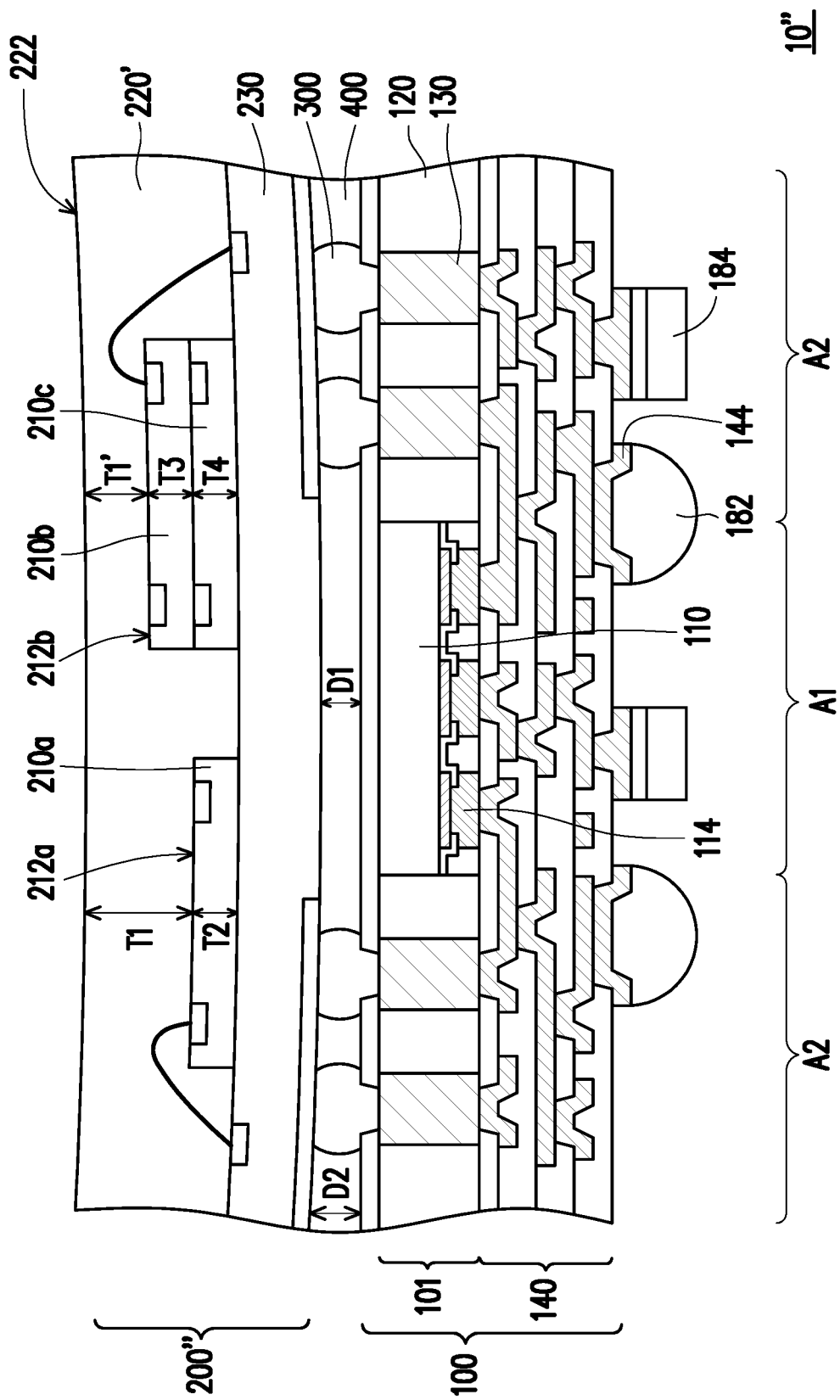
FIG. 12 illustrates a cross sectional view of a package on package structure according to some exemplary embodiments of the present disclosure.

FIG. 12 illustrates a cross sectional view of a package on package structure according to some exemplary embodiments of the present disclosure. It is noted that the package on package structure 10" shown in FIG. 12 contains many features same as or similar to the package on package structure 10 disclosed earlier with FIG. 8. For purpose of clarity and simplicity, detail description of same or similar features may be omitted, and the same or similar reference numbers denote the same or like components. The main differences between the package on package structure 10" shown in FIG. 12 and the package on package structure 10 shown in FIG. 8 are described as follows.

In some embodiments, the second package 200' includes a plurality of second semiconductor devices 210a, 210b, 210c disposed on a redistribution structure 230 and a second encapsulating material 220 encapsulating the second semiconductor devices 210a, 210b. In some embodiments, the redistribution structure 230 may be a package substrate. In other embodiments, the redistribution structure 230 may be a redistribution layer (RDL) similar to the redistribution structure 140. In some embodiments, a shortest distance T1 from an upper surface 222 of the second encapsulating material 220 to a topmost surface of the second semiconductor devices 210a, 210b, 210c is greater than or substantially equal to twice the greatest thickness of the second semiconductor devices 210a, 210b, 210c.

In the present embodiment, the second semiconductor devices 210b, 210c are stacked on top of one another on the redistribution structure 230, and the second semiconductor device 210a is disposed besides the second semiconductor devices 210b, 210c. The thicknesses T2, T3, T4 of the second semiconductor devices 210a, 210b, 210c may be the same. In this case, the shortest distance T1' from the upper surface 222 to the topmost surface 212b of the second semiconductor devices 210a, 210b, 210c is greater than or substantially equal to twice the thickness T2, T3 or T4 of any one of the second semiconductor device 210a, 210b, 210c. In other embodiments, the thicknesses T2, T3, T4 of the second semiconductor devices 210a, 210b, 210c may be different. For example, the thicknesses T3 of the second semiconductor device 210b is greater than the thicknesses T4 of the second semiconductor device 210c. In this case, the shortest distance T1' from the upper surface 222 to the topmost surface 212b of the second semiconductor device 210b is greater than or substantially equal to twice the thickness T3 of the second semiconductor device 210b (i.e. if T3≥T4, T1'≥2·T3). Under this circumstance, the distance T1 from the upper surface 222 to the top surface 212a of the second semiconductor device 210a would also be greater than or substantially equal to twice the thickness T2 since the sum of the thicknesses T3 and T4 is greater than the thickness T2. Certainly, if the thickness T2 is greater than the sum of the thickness T3 and the thickness T4, the distance T1 from the upper surface 222 to the top surface 212a becomes the shortest distance among the distance T1 and T1', then the shortest distance T1 has the criticality in terms of deciding the warpage of the second package 200'. It is noted that the arrangement and the number of the second semiconductor devices 210a, 210b, 210c in the second package 200" is merely for illustration and the disclosure is not limited thereto.

With such configuration, the second package 200" would be in concave warpage profile after thermal process, which means the gap width between the first package 100 and the second package 200' gradually reduces from the peripheral region A2 to the central region A1. Thereby, when the underfill 400 is dispensed from the peripheral region A2 and flows toward the central region A1, the underfill 400 can flow over the central region A1 easily owing to capillary action, and fill the gap between the first package 100 and the second package 200" without void formation. Therefore, yield rates of the package on package structures in the disclosure are significantly improved.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, a package on package structure includes a first package, a plurality of conductive bumps, a second package and an underfill. The conductive bumps are disposed on a second surface of the first package and electrically connected to the first package. The second package is disposed on the second surface of the first package through the conductive bumps, and includes a semiconductor device and an encapsulating material encapsulating the semiconductor device. A shortest distance from an upper surface of the encapsulating material to an upper surface of the semiconductor device is greater than or substantially equal to twice a thickness of the semiconductor device. The underfill is filled between the first package and the second package.

In accordance with some embodiments of the disclosure, a package on package structure includes a first package, a plurality of conductive bumps, a second package and an underfill. The first package includes an encapsulated semiconductor device and a redistribution structure. The encapsulated semiconductor device includes a first semiconductor device, a first encapsulating material encapsulating the first semiconductor device, and a plurality of through vias extending through the first encapsulating material. The redistribution structure is disposed on a first surface of the encapsulated semiconductor device and electrically connected to the encapsulated semiconductor device. The conductive bumps are disposed on a second surface of the encapsulated semiconductor device and electrically connected to the encapsulated semiconductor device. The second surface is opposite to the first surface. The second package is disposed on a second surface of the encapsulated semiconductor device, and includes a second semiconductor device and a second encapsulating material encapsulating the second semiconductor device. A shortest distance from an upper surface of the second encapsulating material to an upper surface of the second semiconductor device is greater than or substantially equal to twice a thickness of the second semiconductor device. The underfill is filled between the first package and the second package.

In accordance with some embodiments of the disclosure, a package on package structure includes a first package, a plurality of conductive bumps, a second package and an underfill. The first package includes an encapsulated semiconductor device and a redistribution structure disposed on a first surface of the encapsulated semiconductor device and electrically connected to the encapsulated semiconductor device. The conductive bumps are disposed on a second surface of the encapsulated semiconductor device and electrically connected to the encapsulated semiconductor device. The second package is disposed on the second surface through the conductive bumps and includes a plurality of semiconductor devices and an encapsulating material encapsulating the semiconductor devices. A shortest distance from an upper surface of the encapsulating material to a topmost surface of the semiconductor devices is greater than or substantially equal to twice a greatest thickness of the semiconductor devices. The underfill is filled between the first package and the second package.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package on package structure, comprising:
a first package;
a plurality of conductive bumps disposed on a surface of the first package and electrically connected to the first package;
a second package disposed on the surface of the first package through the conductive bumps, and comprising a plurality of semiconductor devices and an encapsulating material encapsulating the semiconductor devices, wherein a shortest distance from an upper surface of the encapsulating material to a topmost surface of the semiconductor devices is greater than or substantially equal to twice a thickness of the semiconductor devices; and
an underfill filled between the first package and the second package.

2. The package on package structure as claimed in claim 1, wherein the conductive bumps are disposed on a peripheral region of the surface.

3. The package on package structure as claimed in claim 1, wherein a lower surface of the second package is curved toward the surface of the first package, wherein the lower surface faces the surface.

4. The package on package structure as claimed in claim 1, wherein a shortest distance from a central region of the surface to the second package is smaller than a shortest distance from anywhere on a peripheral region of the surface to the second package.

5. The package on package structure as claimed in claim 1, wherein a distance between the first package and the second package gradually reduces from a peripheral region to a central region of the package on package structure.

6. The package on package structure as claimed in claim 1, wherein the plurality of semiconductor devices are disposed side-by-side in the encapsulating material.

7. The package on package structure as claimed in claim 1, wherein at least two semiconductor devices among the plurality of semiconductor devices are stacked and embedded in the encapsulating material.

8. The package on package structure as claimed in claim 1, wherein the underfill covers a central region and a peripheral region of the surface and encapsulates the conductive bumps.

9. A package on package structure, comprising:
an encapsulated semiconductor device comprises a first semiconductor device, a first encapsulating material encapsulating the first semiconductor device, and a plurality of through vias extending through the first encapsulating material; and
a redistribution structure disposed on a first surface of the encapsulated semiconductor device and electrically connected to the encapsulated semiconductor device;
a plurality of conductive bumps disposed on a second surface of the encapsulated semiconductor device and electrically connected to the encapsulated semiconductor device, wherein the second surface is opposite to the first surface;
a second package disposed on a second surface of the encapsulated semiconductor device, and comprising a plurality of second semiconductor devices and a second encapsulating material encapsulating the second semiconductor devices, wherein a shortest distance from an upper surface of the second encapsulating material to a topmost surface of the second semiconductor devices is greater than or substantially equal to twice a thickness of the second semiconductor devices; and
an underfill filled between the encapsulated semiconductor device and the second package.

10. The package on package structure as claimed in claim 9, wherein a shortest distance from a central region of the second surface to the second package is smaller than a shortest distance from anywhere on a peripheral region of the second surface to the second package.

11. The package on package structure as claimed in claim 10, wherein the conductive bumps are disposed on the peripheral region.

12. The package on package structure as claimed in claim 10, wherein the underfill covers the central region and the peripheral region and encapsulates the conductive bumps.

13. The package on package structure as claimed in claim 9, wherein the plurality of second semiconductor devices are disposed side-by-side in the second encapsulating material.

14. The package on package structure as claimed in claim 13, wherein at least two second semiconductor devices among the plurality of second semiconductor devices are stacked and embedded in the encapsulating material.

15. The package on package structure as claimed in claim 9, wherein a lower surface of the second package is curved toward the surface.

16. A package on package structure, comprising:
a first package comprising an encapsulated semiconductor device and a redistribution structure disposed on a first surface of the encapsulated semiconductor device and electrically connected to the encapsulated semiconductor device;
a plurality of conductive bumps disposed on a second surface of the encapsulated semiconductor device and electrically connected to the encapsulated semiconductor device;
a second package disposed on the second surface through the conductive bumps and comprising a plurality of semiconductor devices and an encapsulating material encapsulating the semiconductor devices, wherein a shortest distance from an upper surface of the encapsulating material to a topmost surface of the semiconductor devices is greater than or substantially equal to twice a greatest thickness of the semiconductor devices; and an underfill filled between the first package and the second package.

17. The package on package structure as claimed in claim 16, wherein a shortest distance from a central region of the second surface to the second package is smaller than a shortest distance from anywhere on a peripheral region of the second surface to the second package.

18. The package on package structure as claimed in claim 16, wherein a lower surface of the second package is curved toward the second surface.

19. The package on package structure as claimed in claim 16, wherein the semiconductor devices are arranged in a side-by-side manner.

20. The package on package structure as claimed in claim 16, wherein the semiconductor devices are stacked on top of one another.

* * * * *